April 8, 1969 H. R. CAMENZIND 3,437,944

THREE-STATE AMPLIFIER

Filed Jan. 10, 1966

INVENTOR
HANS R. CAMENZIND

BY Robert Lewis

ATTORNEY

United States Patent Office 3,437,944

Patented Apr. 8, 1969

3,437,944

THREE-STATE AMPLIFIER

Hans R. Camenzind, Lexington, Mass., assignor to P. R. Mallory & Co. Inc., Indianapolis, Ind., a corporation of Delaware Filed Jan. 10, 1966, Ser. No. 519,508
Int. Cl. H03f 3/38
U.S. Cl. 330—10 6 Claims

ABSTRACT OF THE DISCLOSURE

A three state asymmetrical amplifier having regenerative feedback to the output of the amplifier.

The present invention relates to three-state amplifiers and more particularly to the means and methods for providing an amplifier having two conducting states and a third state which works with a standby current of only a few nanoamperes.

There is an ever existing need for equipment such as intercoms, paging systems, and the like, which can be left running without appreciably draining the battery power source. Accordingly, the present invention provides an amplifier for such equipment that has three stable states rather than two. That is, there are two conducting states, as in a two-state amplifier, and a third state which is a standby state when there is no input signal provided to the amplifier.

The third state, or the standby state, of the amplifier of the present invention may be accomplished by having a resistor-capacitor feedback network coupled between the input and output of the amplifier. As one of the two conducting states is initiated, the feedback circuit causes the amplifier to oscillate in a manner analogous to the operation of an astable multivibrator. The duty-cycle of the produced rectangular waveform is adjusted by superimposing the input signal with the feedback signal. As the input signal is reduced to ground potential, the feedback signal does not have sufficient magnitude to drive the amplifier. Hence, all transistors turn off and only a minute amount of leakage current is flowing. This state, with no input signal, is the standby state for the amplifier. The feedback network is a means for oscillating the amplifier when it is conducting and is connected between the input and output means for the amplifier so as to turn the amplifier off when the input signal reaches a predetermined level.

The circuitry of the present invention is designed so that integrated circuit manufacturing techniques can be used to fabricate small, light weight, and inexpensive three-state amplifiers.

It is an object of the present invention, therefore, to provide an amplifier having a standby state in which only a few nanoamperes is drawn from the battery power supply.

It is another object of the present invention to provide an amplifier having two conducting states and a nonconducting state, said nonconducting state occurring when there is no input signal to said amplifier.

It is a further object of the present invention to provide an amplifier for intercoms, paging systems, or the like, which will not appreciably drain the battery power supply when the amplifier is in a standby state.

It is still another object of the present invention to provide a two-state amplifier with a feedback network between the input and output means of said amplifier so that when the input signal returns to ground potential, the feedback signal does not have sufficient magnitude to drive the amplifier, thereby creating a standby state for said amplifier.

The present invention, in another of its aspects, relates to novel features of the instrumentalities described herein for teaching the principal object of the invention and to the novel principles employed in the instrumentalities whether or not these features and principles may be used in the said object and/or in the said field.

Other objects of the invention and the nature thereof will become apparent from the following description considered in conjunction with the accompanying drawings and wherein like reference numbers describe elements of similar function therein and wherein the scope of the invention is determined rather from the dependent claims.

For illustrative purposes, the invention will be described in conjunction with the accompanying drawings in which.

Generally speaking, the present invention is a three-state amplifier comprising: a first amplifying network connected to a positive voltage source and to an output means for said amplifier; a second amplifying network connected to a negative voltage source and to said output means for said amplifier; an input means for said amplifier; regenerative feedback means connected to said output means; a switching circuit coupled to said input means and to said feedback means for accepting a combination of signals therefrom, and coupled to said first and second amplifying networks for switching them alternately between a state in which said first amplifying network is conducting, while said second amplifying network is non-conducting, and an opposite state, in response to the polarity of said combination of signals, and for switching said amplifying networks to a state in which both of said first and second amplifying networks are non-conducting when said signal provided to said input means reaches a predetermined level.

Figure 1:
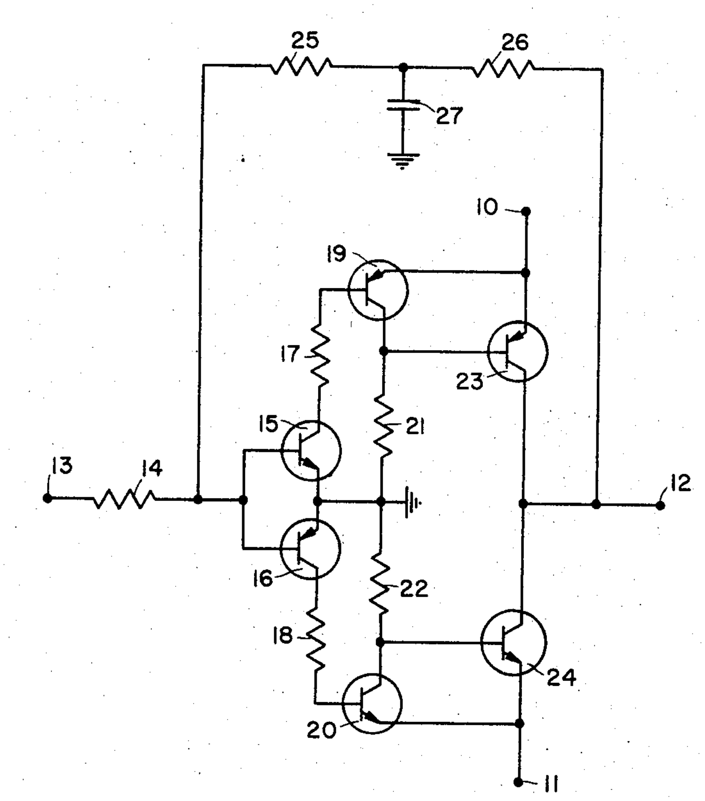
FIGURE 1 is a schematic of the three-state amplifier of the present invention.

Referring now to the drawing, and particularly to the schematic of FIGURE 1, the component parts and the circuit of the present invention can be visualized in conjunction with the following description.

The positive voltage for the amplifier is provided at the terminal 10 and the negative voltage is provided at the terminal 11. The output of the amplifier is provided at the terminal 12 and the input to the amplifier is provided at the terminal 13. The resistor 14 is connected between the input terminals 13 and the bases of the transistors 15 and 16. The emitters of the transistors 15 and 16 are connected together and to ground. The collector of the transistor 15 is coupled through the resistor 17 to the base of the transistor 19 and the collector of the transistor 16 is connected through the resistor 18 to the base of the transistor 20. The emitter of the transistor 19 is connected to the terminal 10 and the collector of the transistor 19 is connected through the resistor 21 to ground. The collector of the transistor 19 is coupled to the base of the transistor 23. The emitter of the transistor 23 is connected to the positive voltage terminal 10. The collector of the transistor 20 is coupled through the resistor 22 to ground and directly to the base of the transistor 24. The emitter of the transistor 20 and the emitter of the transistor 24 are connected to the negative voltage terminal 11. The collector of the transistor 23 is connected to the collector of the transistor 24.

A feedback circuit consisting of the resistors 25 and 26 and the capacitor 27 is connected between the output terminal 12 and the junction between the resistor 14 and the bases of the transistors 15 and 16. The resistors 25 and 26 are connected in series and the capacitor 27 is connected from a midpoint between said resistors to ground.

With the above description of circuitry in mind, and by making reference to the drawing figures, the following analysis of operation will serve to convey the functional details of the present invention.

The amplifier of the present invention has three stable states which are as follows.

STATE 1.—Transistors 15, 19 and 24 conducting and transistors 16, 20 and 23 nonconducting.

STATE 2.—Transistors 16, 20 and 23 conducting and transistors 15, 19 and 24 nonconducting.

STATE 3.—All transistors nonconducting.

One side of the amplifier is turned on when a signal of sufficient magnitude is applied to the input terminal 13. The polarity of the input signal will determine which of the two transistors 15 and 16 will conduct. The amplifier then starts oscillating through the feedback network consisting of the resistors 25 and 26 and the capacitor 27. The duty-cycle of the produced rectangular waveform is adjusted by superimposing the input signal with the feedback signal. That is, the input signal is superimposed on the feedback voltage to change the on-to-off ratio of the output waveform. The operation of the conducting portion of the amplifier is therefore, analogous to the operation of an astable multivibrator.

As the input signal provided to the terminal reduces to ground potential, the feedback signal does not have sufficient magnitude to drive the amplifier. Hence, all of the transistors turn off and only a minute amount of leakage current is flowing. The amplifier is then in the STATE 3.

Figure 2:
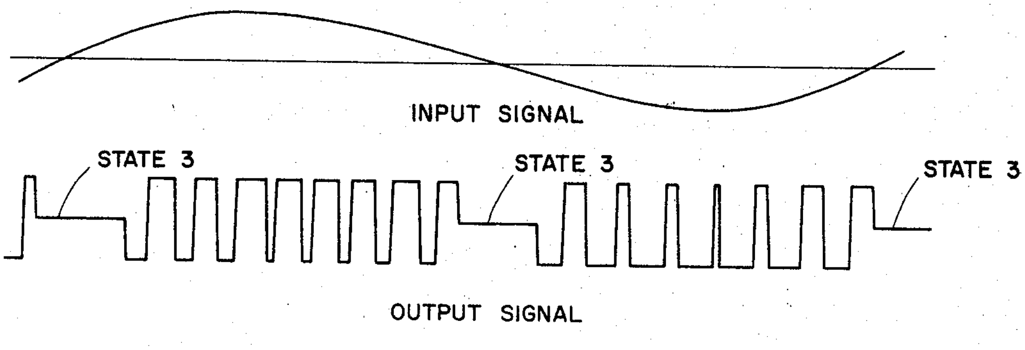
FIGURE 2 is a diagram showing the waveform of the input signal and output signal of the three-state amplifier of the present invention.

Referring now to FIGURE 2, it can be seen that the amplifier produces its carrier signal only if the input signal exceeds a certain level. Each time the input signal goes through zero, the amplifier will be in STATE 3 for a short time. This produces some distortion (similar to the "cross over distortion" in class B amplifiers), but it has been found that the quality of the amplified signal is high enough by far for voice amplification. In the standby condition of STATE 3, the amplifier of the present invention will work with a current of only a few nanoamperes. This current is so low that in many applications (such as intercoms, paging systems, or megaphones) the amplifier can be left running without appreciably draining a supply battery.

What is claimed is:

1. A three state amplifier comprising: a first amplifying network connected to a positive voltage source; a second amplifying network connected to a negative voltage source; an input means for said amplifier; an output means for said amplifier; regenerative feedback means connected to said output means; a switching circuit coupled to said input means and to said feedback means for accepting a combination of signals therefrom, and coupled to said first and second amplifying networks for switching said networks alternately between a state in which said first amplifying network is conducting, while said second amplifying network is nonconducting, and an opposite state, in response to the polarity of said combination of signals, and for switching said amplifying networks to a state in which both of said first and second amplifying networks are nonconducting when said signal provided to said input means reaches a predetermined level.

2. An amplifier as in claim 1 wherein said feedback network comprises a first and a second resistor connected in series between said input means and said output means and a capacitor connected from a midpoint between said first and said second resistors and ground.

3. An amplifier as in claim 1 wherein said switching network comprises a first transistor having a base and having an emitter and a collector coupled between said positive voltage source and ground; a second transistor having a base and having an emitter and a collector coupled between said negative voltage source and ground; a third transistor having a base and having an emitter and a collector coupled between said first-transistor base and ground; and a fourth transistor having a base and having an emitter and a collector coupled between said second-transistor base and ground, the bases of said third and fourth transistors being connected to said input and to said feedback means.

4. An amplifier as in claim 1 wherein said first amplifying network comprises a transistor having a base coupled to said switching circuit and having an emitter and a collector connected between said positive voltage source and said output means; and wherein said second amplifying network comprises a transistor of opposite conductivity type from that of said first-network transistor, said second-network transistor having a base coupled to said switching circuit and having an emitter and a collector connected between said negative voltage supply and said output means.

5. An amplifier as in claim 3 wherein said first and fourth switching-circuit transistors and the transistor of said first amplifying network are PNP-type transistors, and said second and third switching-circuit transistors and the transistor of said second amplifying network are NPN-type transistors; and wherein the bases of said first and second amplifying-network transistors are connected to the collectors of said first and second switching-circuit transistors respectively.

6. An amplifier as in claim 5, wherein the collectors of said first and second switching-circuit transistors are each connected to ground potential through a resistor.

References Cited

UNITED STATES PATENTS

| | | | |
|---|---|---|---|
| 3,304,507 | 2/1967 | Weekes et al. | 328—151 |
| 3,320,543 | 5/1967 | Hopengarter et al. | 330—30 X |

NATHAN KAUFMAN, *Primary Examiner.*

U.S. Cl. X.R.

330—13, 17, 26